(12) United States Patent
Babb

(10) Patent No.: US 6,429,831 B2
(45) Date of Patent: *Aug. 6, 2002

(54) LAMINATE RFID LABEL AND METHOD OF MANUFACTURE

(75) Inventor: Susan M. Babb, Pewaukee, WI (US)

(73) Assignee: Brady Worldwide, Inc., Milwaukee, WI (US)

(*) Notice: Subject to any disclaimer, the term of this patent is extended or adjusted under 35 U.S.C. 154(b) by 0 days.

This patent is subject to a terminal disclaimer.

(21) Appl. No.: 09/903,197

(22) Filed: Jul. 11, 2001

Related U.S. Application Data

(63) Continuation of application No. 09/229,407, filed on Jan. 13, 1999, now Pat. No. 6,262,692.

(51) Int. Cl.[7] .............................................. G06K 19/02
(52) U.S. Cl. ........................ 343/895; 428/189; 340/572
(58) Field of Search ......................... 343/895, 700 MS, 343/873, 872; 29/600; 340/570, 572; 428/189, 897

(56) References Cited

U.S. PATENT DOCUMENTS

| | | | |
|---|---|---|---|
| 5,528,222 A | 6/1996 | Moskowitz et al. ........ | 340/572 |
| 5,566,441 A | 10/1996 | Marsh et al. ................ | 29/600 |
| 5,654,693 A | 8/1997 | Cocita ........................ | 340/572 |
| 5,705,852 A | 1/1998 | Orihara et al. .............. | 257/679 |
| 5,708,419 A | 1/1998 | Isaacson et al. ............ | 340/572 |
| 5,751,256 A | 5/1998 | McDonough et al. ....... | 343/873 |
| 6,025,054 A | 2/2000 | Tiffany, III ................. | 428/189 |
| 6,262,692 B1 * | 7/2001 | Babb .......................... | 343/895 |

FOREIGN PATENT DOCUMENTS

| | | | | |
|---|---|---|---|---|
| EP | 0 682 321 A | 11/1995 | ......... | G06K/19/077 |
| EP | 0 768 620 A2 | 4/1997 | ......... | G06K/13/077 |
| WO | 98 54002 A | 12/1998 | ........... | B42D/15/10 |

OTHER PUBLICATIONS

Byron A. Hunter, "Chemical Blowing Agents Chemistry And Decomposition Mechanisms", Uniroyal Chemical, Aug. 1991.

"Introduction To Expancel® Microspheres", Expancel/Nobel Industries, Apr. 1991.

* cited by examiner

*Primary Examiner*—Don Wong
*Assistant Examiner*—James Clinger
(74) *Attorney, Agent, or Firm*—Quarles & Brady LLP

(57) ABSTRACT

A laminated label has a first conductive material defining electrical attachment pads; a dielectric material surrounding the attachment pads; a second conductive material deposited on the dielectric material and forming an antenna electrically connected to the attachment pads. A layer of expandable material forms a protective cavity surrounding the attachment pads. An IC chip is received in the protective cavity and connected to the antenna.

1 Claim, 3 Drawing Sheets

LAMINATE RFID LABEL AND METHOD OF MANUFACTURE

CROSS REFERENCE TO RELATED APPLICATIONS

This application is a continuation of patent application Ser. No. 09/229,407 filed on Jan. 13, 1999 now U.S. Pat. No. 6,262,692.

STATEMENT REGARDING FEDERALLY SPONSORED RESEARCH OR DEVELOPMENT (Not Applicable)

BACKGROUND OF THE INVENTION

The field of invention is radio frequency identification (RFID) labels, more particularly a laminate label having an expandable layer.

RFID devices are known in the art, such as disclosed in U.S. Pat. No. 5,347,263. These devices are used in systems for access control, animal feeding and health programs, inventory control, process control, and security applications.

A typical RFID system has a passive RFID label having circuitry therein and a separate RFID reader/writer. The RFID reader/writer energizes the RFID label circuitry by transmitting a power signal. The power signal may convey data which is stored in memory incorporated in the RFID label circuitry. In response to the power signal the RFID label circuitry may transmit a response signal containing data stored in its memory. The RFID reader/writer receives the response signal and interprets the data contained therein. The data is then transmitted to a host computer for processing.

In order to minimize the cost of labels, the labels are fabricated in large quantities. One particular method of making the RFID label is to print a conductive material, such as silver conductive ink, in a pattern defining multiple antennae, onto a substrate. The ink may be printed using silk screening techniques, such as in a sheet fed or roll operation. Once the antennae are printed, each antenna is die cut into individual pieces. Each piece is placed in a carrier where an integrated circuit (IC) chip, such as a flip chip, is electrically connected to the antenna using conventional chip attachment methods. The chip is then encapsulated in an epoxy material and the entire assembly is sandwiched between protective layers.

This particular method of making an RFID label has several drawbacks. The substrate material is expensive and when die cut, there is significant waste. Once the individual antennae are die cut into individual pieces, each piece must be loaded into a carrier for subsequent processing. If a window is not cut into the substrate, when the chip is encapsulated, there is a bump on the label which can result in the chip being easily ripped off of the label rendering the label inoperative. Finally, the bump on the chip makes putting the label through marking equipment, such as thermal transfer, ink jet, or laser printers, difficult.

Another method of manufacturing an RFID label, described in U.S. Pat. No. 5,528,222, has an antenna formed as an integral part of an insulating substrate and a circuit chip mounted on the substrate. This particular label requires a substrate which increases the label thickness and the overall cost of the label. To minimize the label thickness, a window may be cut in the substrate allowing insertion of the chip into the window. Cutting a window in the substrate, however, further increases the cost of the label.

BRIEF SUMMARY OF THE INVENTION

The present invention provides a laminated label having a first conductive material defining electrical attachment pads; a dielectric material deposited within a label area and surrounding the attachment pads; a second conductive material defining an antenna deposited on the dielectric material and being electrically connected to the attachment pads; and an expandable material deposited in the label area, wherein expanding the expandable material forms a cavity surrounding the attachment pads for receiving an IC chip.

A general objective of the invention is to provide a label which is easy and economical to manufacture. The laminated label may be formed by silk screening the materials forming the label on a releasable liner. The laminated label is easily formed using automated equipment and it does not require a substrate.

Another objective of the present invention is to provide an RFID label having an IC chip that does not form a bump on the label surface. This objective is accomplished by forming a cavity in the label for receiving the IC chip. The cavity provides a receptacle for mounting an IC chip and avoiding a bump on the label.

The foregoing and other objects and advantages of the invention will appear from the following description. In the description, reference is made to the accompanying drawings which form a part hereof, and in which there is shown by way of illustration a preferred embodiment of the invention.

DETAILED DESCRIPTION OF THE PREFERRED EMBODIMENTS

Figure 1:
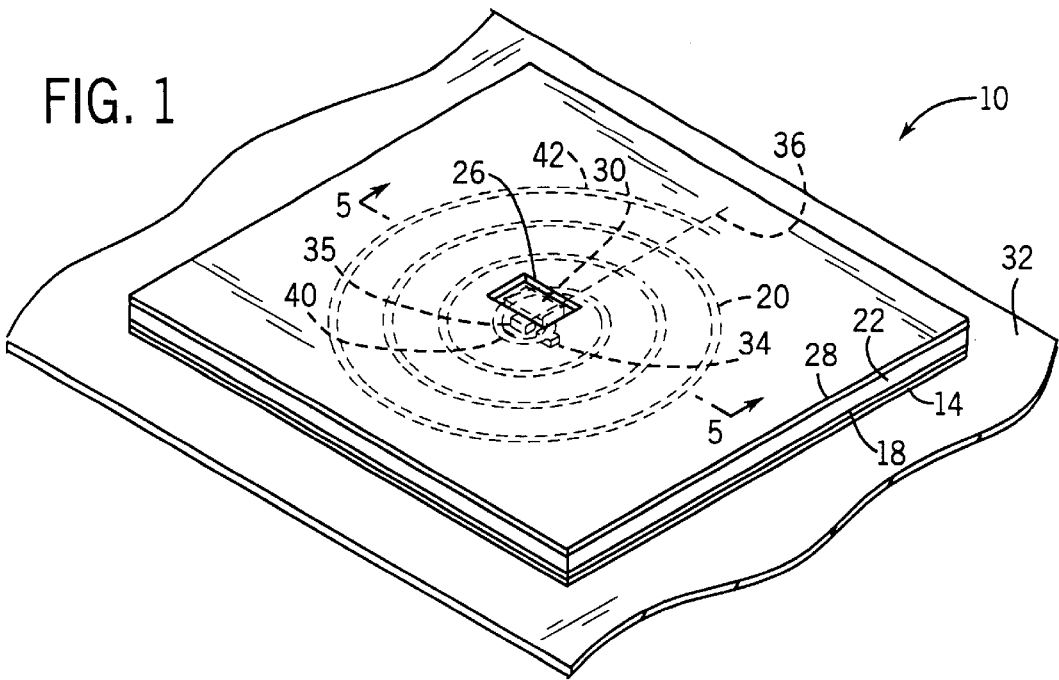
FIG. 1 is a perspective view of an RFID label incorporating the present invention.
Figure 5:
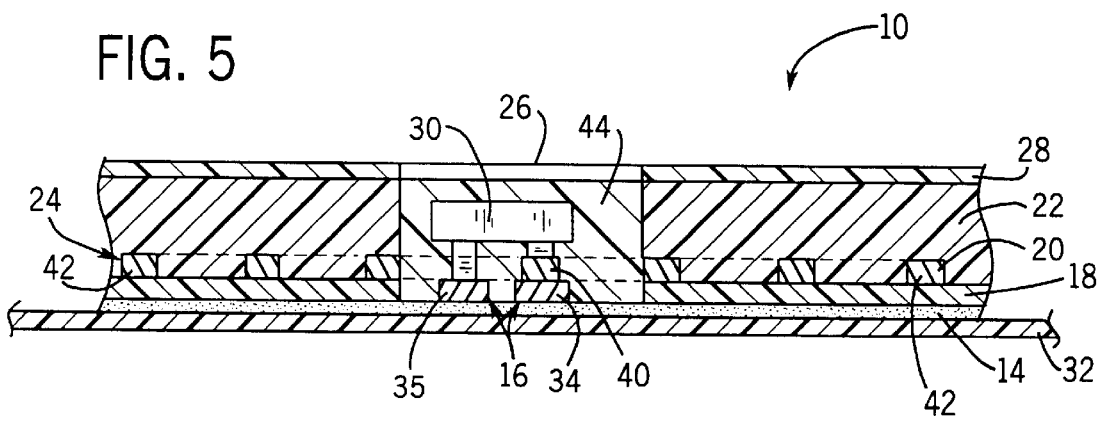
FIG. 5 is a sectional view of the label of FIG. 1 along line 5—5.
Figure 2:
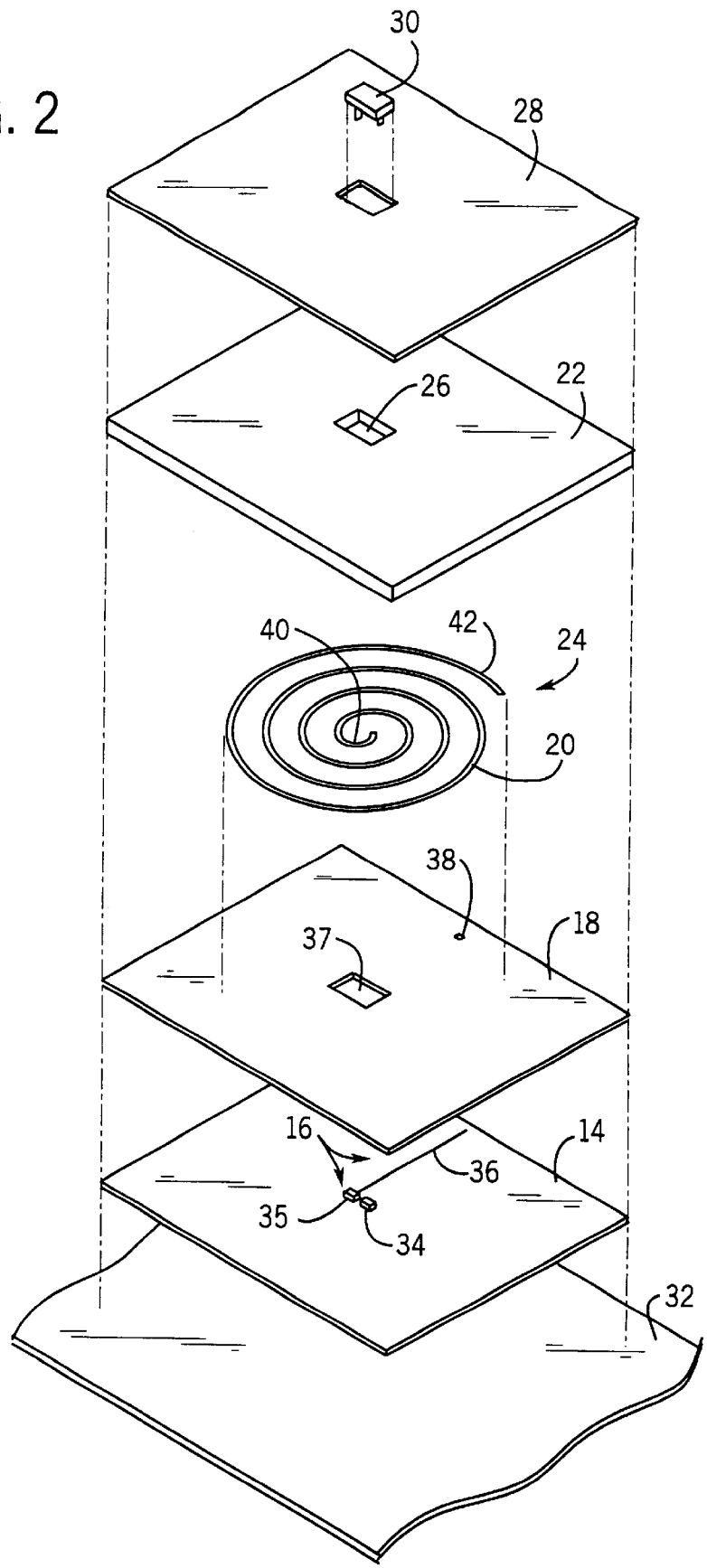
FIG. 2 is an exploded perspective view of the label of FIG. 1.

Referring to FIGS. 1, 2, and 5, a laminated RFID label 10 has five layers 14, 16, 18, 20, and 22, and forms a protective cavity 26 for RFID circuitry in the form of an IC chip 30. One of the layers 22 defines the cavity 26 for the IC chip 30, which is electrically connected to an antenna 24. The label 10 may be encapsulated or receive additional protective or functional layers 28 suitable for specific applications.

Referring to FIGS. 2 and 5, the first layer 14 is an adhesive material which is deposited on a release liner 32. The release liner is preferably a silicone coated paper. However, any liner having releasable properties may be used without departing from the scope of the present invention. By forming the label 10 on the release liner 32, a substrate is not required, thus reducing the cost of the label 10.

The adhesive first layer 14 may be a UV curable pressure sensitive adhesive, such as Acheson ML25251 available from Acheson Colloids Company, Port Huron, Mich. This layer 14 provides an adhesive surface for the finished label 10 and defines the boundary of the label area of the generally rectangular label 10. Although, the label 10 described herein is generally rectangular, the label 10 may be any shape without departing from the scope of the present invention.

The second layer 16 is an electrically conductive material which is selectively deposited onto the first layer 14. It is formed of a metallic conductive ink, such as Acheson Electrodag® 479SS available from Acheson Colloids Company, Port Huron, Mich. The second layer 16 may be deposited using silk screening, or other methods known in the art for depositing an electrically conductive material, such as electro deposition, hot stamping, etching or the like.

As shown best in FIG. 2, the electrically conductive material 16 is deposited onto portions of the first layer 14 defining at least two landing pads 34, 35 for IC chip attachment and a cross over pass 36. The landing pads 34 provide electrical attachment pads for electrically connecting the fourth layer 20 to the IC chip 30. As more clearly described below, in cooperation with the third layer 18, the cross over pass 36 electrically connects one of the landing pads 34 to a portion of the antenna 24 without shorting out other antenna portions. Although two landing pads 34, 35 are described herein, more than two landing pads 34, 35 may be formed for connecting to the IC chip 30 without departing from the scope of the present invention.

Figure 3:
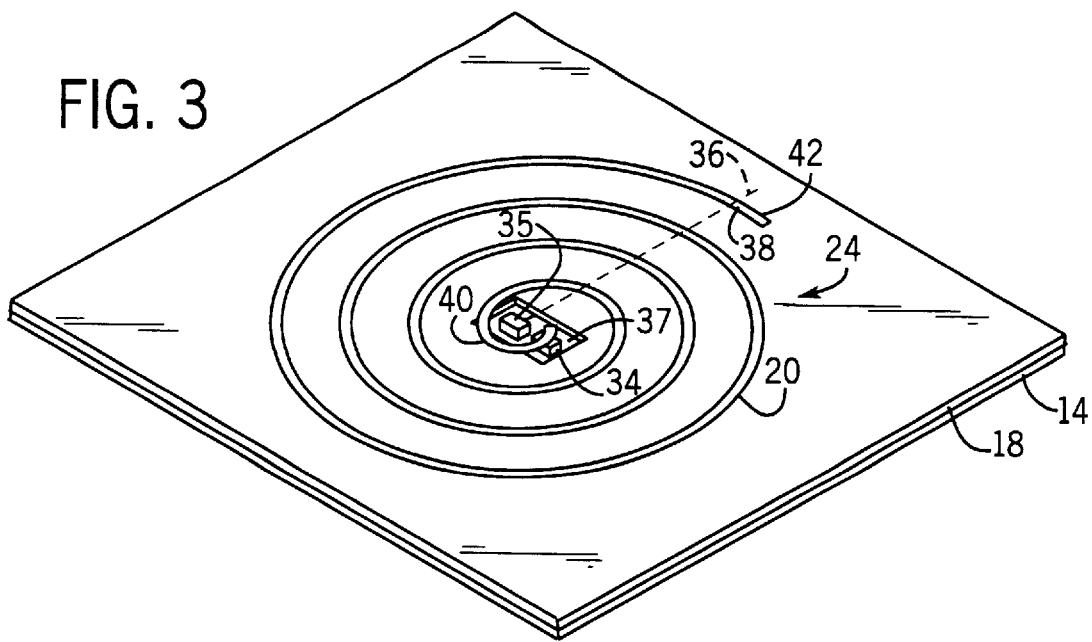
FIG. 3 is a partial perspective view of the label of FIG. 1 showing the first four layers.
Figure 4:
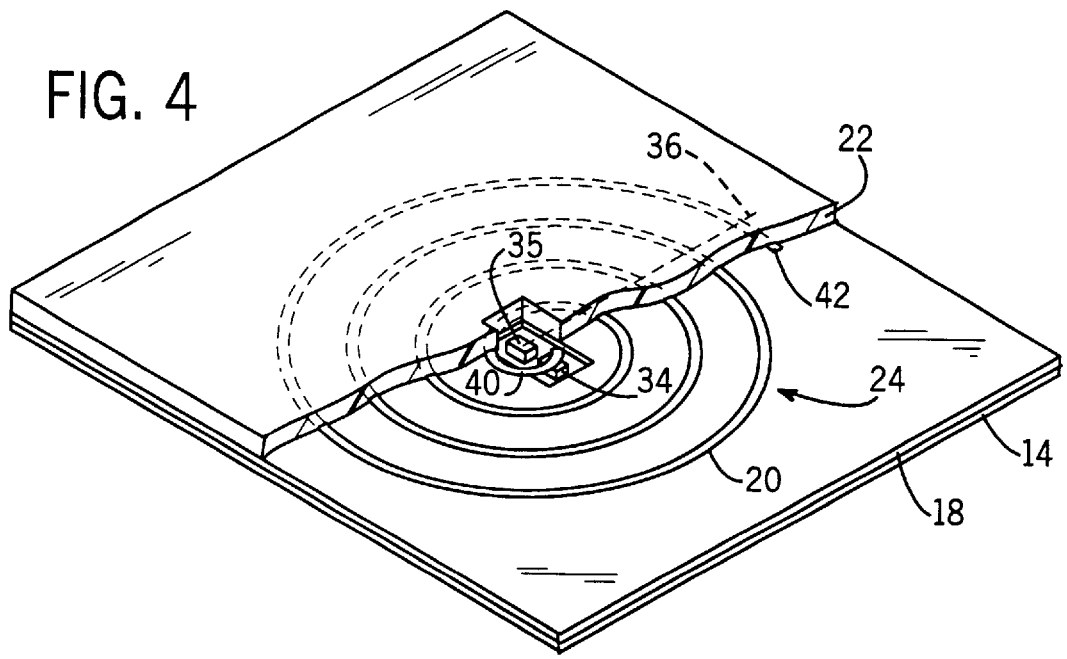
FIG. 4 is a cut-away perspective view of the label of FIG. 1.

Referring to FIGS. 2 and 3, the third layer 18 is a dielectric material, such as Acheson Electrodag® 451SS available from Acheson Colloids Company, Port Huron, Mich. It is deposited within the label boundary and it has an annular shape which surrounds a small central area 37 containing the landing pads 34, 35. The central area 37 is thus not coated with the dielectric material 18. The area 37 is sized to accommodate the IC chip 30 which is mounted over and electrically connected to the landing pads 34, 35. A conductive via 38 for electrically connecting the cross over pass 36 to the fourth layer 20 is also formed by leaving a small portion of the cross over pass 36 uncoated by the dielectric material 18.

Looking particularly at FIG. 3, the fourth layer 20 is a metallic conductive ink, such as used in the second layer 16. It is deposited onto the dielectric third layer 18 in a spiral pattern defining an antenna 24. The spiral antenna 24 has a plurality of rings including an inner ring 40 and an outer ring 42. The antenna inner ring 40 is electrically connected to one of the landing pads 34. The antenna outer ring 42 is deposited over the via 38 electrically connecting the antenna outer ring 42 to the other landing pad 35 through the cross over pass 36 without electrically contacting the other antenna rings. Although a spiral antenna is preferred and described herein, any suitable antenna shape may be used without departing from the scope of the present invention.

As shown in FIG. 2, the fifth layer 22 is shaped substantially the same as the dielectric layer 18. It is formed from an expandable material, such as a thermally expandable spacer ink comprising a binder of a polymeric resin system and an expandable additive, such as thermoplastic hollow spheres encapsulating a gas, or a blowing agent.

Preferably, the additive is thermally expandable, such as the thermoplastic hollow spheres, Expancel® 551DU, available from Expancel, Inc., Duluth, Ga. Although Expancel® 551DU is preferred, other expandable additives, such as Expancel® 091DU, Expancel® 461DU, or blowing agents may be used without departing from the scope of the present invention. For example, blowing agents, such as diazoaminobenzene, azobis(isobutyronitrile), dinitroso pentamethylene tetramine, N,N'-dinitroso-N,N'-dimethylterephthalamide, azodicarbonamide, sulfonyl hydrazides, benzene sulfonyl hydrazide, p-toluene sulfonyl hydrazide, p,p-oxybis (benzene sulfonyl hydrazide), sulfonyl semicarbazides, decomposition products of p-toluene sulfonyl semicarbazide, esters of azodicarboxylic acid, and salts of azodicarboxylic acid are known in art and may be combined with the binder to form the expandable layer.

The polymeric resin system includes a resin and a solvent to provide a flexible vehicle which does not degrade upon expansion of the expandable additive. The resin is preferably a polyester, however it could also be a vinyl, ethylene vinyl acetate, acrylic, polyurethane, or a combination thereof, which is mixed with a compatible solvent, such as methyl ethyl ketone, toluene, cyclohexane, glycol ether, or the like.

Preferably, the expandable fifth layer 22 is formulated, such that upon curing, it expands to a thickness substantially equal to the thickness of the epoxy encapsulated IC chip 30. For a chip height of approximately 0.35 mm, the expandable material preferably comprises no more than about 85% solvent, no more than about 30% resin, and no more than about 15% expandable additive. In the preferred embodiment, the expandable layer 22 comprises approximately 70% solvent, 23% resin, and 7% expandable additive. Typical chip heights range from approximately 0.25–0.9 mm and, of course, a different chip height will require a different combination of materials to provide the desired expansion of the expandable material. Although, the expandable material preferably has a thickness substantially equal to the thickness of the encapsulated IC chip, any expandable material thickness greater or less than the IC chip height will provide some protection to the chip and may be used without departing from the scope of the invention.

Following deposition of the expandable layer 22, the laminate article 10 is cured causing the layer 22 to expand. As shown in FIGS. 1, 2, 4, and 5, the expanded material surrounds the landing pads 34, 35 and defines a protective cavity 26 for receiving the IC chip 30 and an epoxy encapsulant 44. Advantageously, by providing the preferred cavity 26 for the IC chip 30 and the encapsulant 44, the IC chip 30 does not form an exposed bump on the finished label 10.

Preferably, the IC chip 10 is a flip chip having a memory and easily electrically connected to the landing pads 34 using conventional chip attachment methods. For example, once the protective cavity 26 is formed, a conductive adhesive, such as a needle dispensed polymeric conductive adhesive or an anisotropic conductive adhesive, is deposited into the cavity to electrically connect the chip 30 to each of the landing pads 34, 35. The IC chip 30 is then placed into the cavity 26 and encapsulated in the epoxy 44. The epoxy 44 deposited into the cavity 26 further protects the IC chip 30 and secures it in place. Although encapsulating the IC chip 30 with the epoxy 44 is described herein, encapsulating the chip is not required to practice the invention and in certain applications may not be desired.

One or more additional layers 28, such as a polymeric resin system comprising resins and solvents described above, may be deposited onto the fifth layer 22. The additional layers 28 may provide a layer which is compatible with thermal transfer, ink jet, or laser printing.

Alternatively, an overlaminate may be deposited on the expandable layer 22 or subsequent layers 28 to provide an adhesive surface to the laminate article 10. An overlaminate is a film, such as a polyester, cellulose acetate, vinyl, polyethylene, polypropylene, styrene, or the like, mixed with an adhesive, such as an acrylic or rubber.

Preferably, each layer 14, 16, 18, 20, and 22 is formed using a silk screening process. The silk screening process may be a sheet fed operation or a roll to roll process. The sheet fed operation will result in sheets of multiple up labels or individual labels. The roll to roll process can supply rolls of labels in addition to sheet forms provided in the sheet fed method.

Deposition of layer material on the central area 37 around the landing pads 34, 35 is prevented by placing, a releasable material, such as foam with a releasable adhesive, over the central area 37 during the silk screening process. Another method includes mounting the chip 30 prior to applying the expandable layer 22 and then notching the squeegee used in the silk screen printing process to avoid striking the chip 30.

Although silk screening is preferred, other printing or deposition techniques, such as rotogravure, may also be used without departing from the scope of the present invention. Regardless of the particular technique chosen, the same process is preferably used to sequentially form each layer 14, 16, 18, 20, and 22 of the laminate article 10.

While there has been shown and described what are at present considered the preferred embodiment of the invention, it will be obvious to those skilled in the art that various changes and modifications can be made therein without departing from the scope of the invention defined by the appended claims. For example, alternative embodiments include eliminating the adhesive first layer, encapsulating the laminate article into a formed tag, or applying the adhesive layer last.

The present invention may also be deposited onto a substrate if the release liner is not suited to the particular application and the added cost of the substrate is justified. For example, in another preferred embodiment an expandable layer may be deposited onto a conventionally formed RFID circuit with a substrate. As described above, the expandable layer forms a protective cavity for an IC chip. A laminated adhesive may then be formed on the substrate or other layers may be deposited onto the expandable layer described above.

I claim:

1. A method of making a laminated article for use as an RFID label comprising the steps of:

printing a first electrically conductive material to form two attachment pads;

printing a dielectric material in a layer surrounding said attachment pads;

printing a second electrically conductive material onto said dielectric material, said second electrically conducting material being shaped to define an antenna;

printing a protective material containing heat expandable spheres in a layer surrounding said attachment pads; and expanding said expandable spheres to form a protective cavity containing said attachment pads.

* * * * *